(12) United States Patent
DeBar et al.

(10) Patent No.: US 9,751,753 B2
(45) Date of Patent: Sep. 5, 2017

(54) INTEGRATION OF ACTIVE DEVICES WITH PASSIVE COMPONENTS AND MEMS DEVICES

(71) Applicant: Newport Fab, LLC, Newport Beach, CA (US)

(72) Inventors: Michael J. DeBar, Tustin, CA (US); David J. Howard, Irvine, CA (US); Jeff Rose, Hawthorne, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/256,340

(22) Filed: Sep. 2, 2016

(65) Prior Publication Data

US 2016/0368764 A1    Dec. 22, 2016

Related U.S. Application Data

(62) Division of application No. 14/695,494, filed on Apr. 24, 2015, now Pat. No. 9,481,568.

(60) Provisional application No. 62/142,085, filed on Apr. 2, 2015.

(51) Int. Cl.
*B81C 1/00* (2006.01)

(52) U.S. Cl.
CPC ...... *B81C 1/00246* (2013.01); *B81C 1/00833* (2013.01); *B81B 2207/015* (2013.01); *B81C 2203/0771* (2013.01)

(58) Field of Classification Search
CPC ................. H01L 27/11807; H01L 2924/1461
See application file for complete search history.

(56) References Cited

U.S. PATENT DOCUMENTS

2011/0147920 A1* 6/2011 Choudhury ......... H01L 23/3677
257/712
2016/0126324 A1   5/2016 Yu et al.

* cited by examiner

*Primary Examiner* — Tran Tran
(74) *Attorney, Agent, or Firm* — Bever, Hoffman & Harms, LLP

(57) ABSTRACT

Integration of active devices with passive components and MEMS devices is disclosed. An integrated semiconductor structure includes an active device having a device top electrode connected to a conductive jumper by a device-side via/interconnect metal stack. The integrated semiconductor structure also includes a passive component having a component bottom plate connected to the conductive jumper by a component side via/interconnect metal stack. The component bottom plate is situated at an intermediate metal level higher than the device top electrode, and the conductive jumper is situated at a connecting metal level higher than the component bottom plate. The conductive jumper reduces undesirable charge flow into the active device during fabrication of the passive component. The passive component can be, for example, a MEMS device.

19 Claims, 5 Drawing Sheets ured States Patent US 9,751,753 B2

INTEGRATION OF ACTIVE DEVICES WITH PASSIVE COMPONENTS AND MEMS DEVICES

RELATED APPLICATIONS

The present application in a divisional of U.S. application Ser. No. 14/695,494 filed Apr. 24, 2015 which claims the benefit of and priority to a provisional patent application entitled "Structure and Method for Integrating Passive Components and MEMS Devices," Ser. No. 62/142,085 filed on Apr. 2, 2015, which disclosure is hereby incorporated fully by reference into the present application.

BACKGROUND

Advances in semiconductor manufacturing processes have made possible the monolithic integration of passive components with active devices in a semiconductor substrate. For example, microelectromechanical systems (MEMS) devices can be connected with active circuitry for driving and/or signal processing of the MEMS devices through various vertical and lateral routing paths in an integrated semiconductor structure. Typically, the passive components, such as MEMS devices, are formed by using a layer-by-layer process over a semiconductor substrate during a back end of line (BEOL) processing after the active devices have been formed in the semiconductor substrate.

In a conventional process of monolithically integrating a MEMS device with active circuitry, a metal layer for forming a bottom electrode of the MEMS device is first formed over a semiconductor substrate, where the metal layer is connected to an active device in the semiconductor substrate through a routing path at the beginning of the fabrication process of the MEMS device. As the conventional process is carried out, the bottom electrode and other electrodes of the MEMS device are patterned using, for example, plasma etching. While the MEMS device is fabricated, however, heat and charge as results of thermal and plasma processes can build up and be transferred to the active device in the semiconductor substrate through the routing path. The heat and charge can adversely impact the performance of the active device as well as the MEMS device.

For example, in a monolithic integrated semiconductor structure formed by using the conventional process, a difference in performance has been observed between two MEMS devices, one connected to active circuitry and the other not. The difference in performance can be attributed in part to either a partial or total breakdown of an active device, such as a complementary-metal-oxide semiconductor (CMOS) transistor, in the active circuitry due to the heat and/or charge transfer. In addition, if too much charge is built up during the fabrication of the MEMS devices, the charge can cause damage to not only the active circuitry but also the MEMS devices.

Thus, there is a need in the art for a monolithic integration technique and structure for effective integration of passive components, such as MEMS devices, with active devices, such as CMOS transistors.

SUMMARY

The present disclosure is directed to integration of active devices with passive components and MEMS devices, substantially as shown in and/or described in connection with at least one of the figures, and as set forth in the claims.

DETAILED DESCRIPTION

Figure 1:
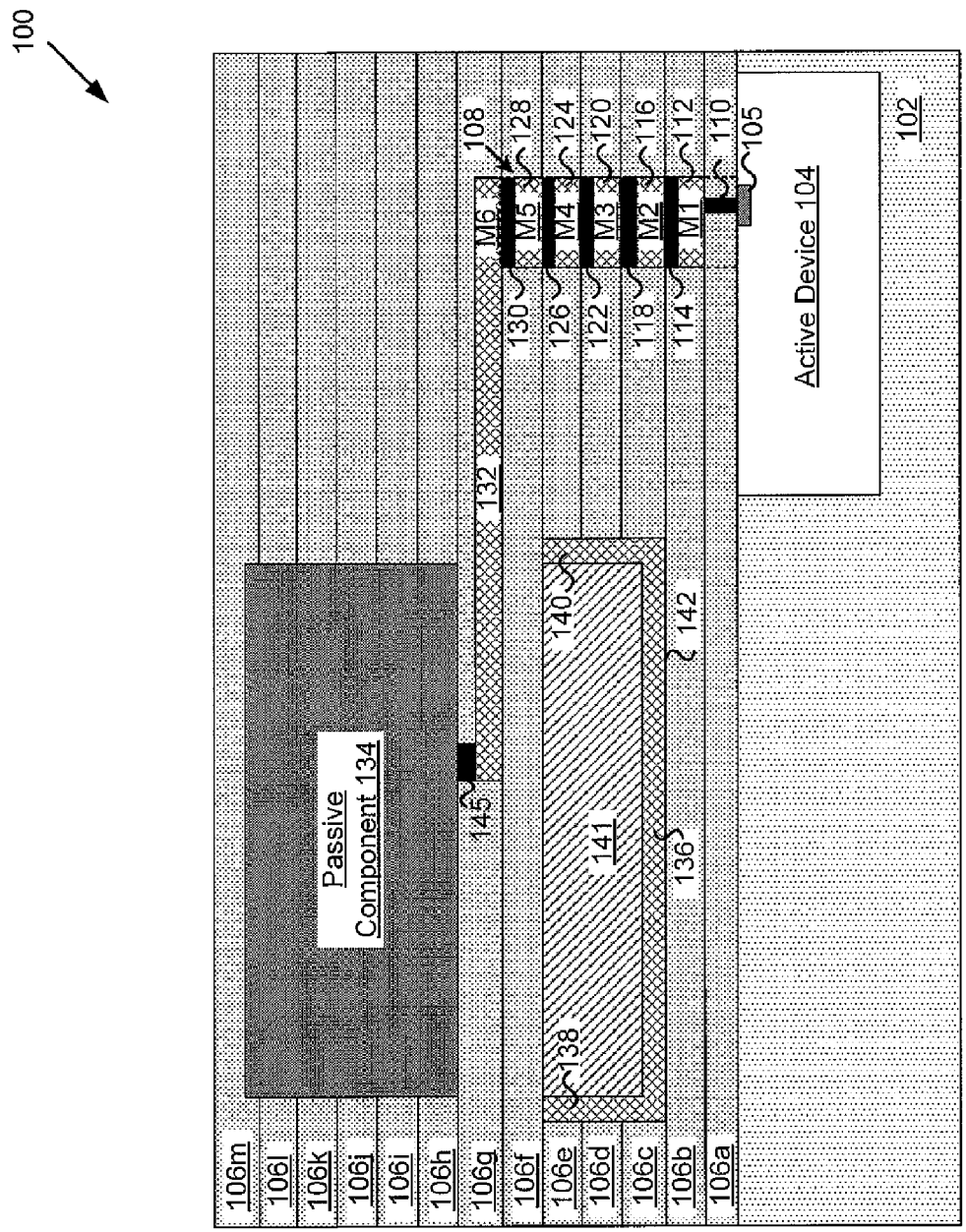
FIG. 1 illustrates a cross-sectional view of a portion of a conventional integrated semiconductor structure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1, FIG. 1 illustrates a cross-sectional view of a conventional integrated semiconductor structure. Semiconductor structure 100 includes active device 104 and passive component 134 electrically connected active device 104 through via 145, routing layer 132 and via/interconnect metal stack 108. As illustrated in FIG. 1, active device 104 is formed in semiconductor substrate 102. Dielectric layers 106a through 106m are successively formed over semiconductor substrate 102. Device top electrode 105 of active device 104 is electrically connected to via/interconnect metal stack 108. Via/interconnect metal stack 108 includes via 110, interconnect metal 112, via 114, interconnect metal 116, via 118, interconnect metal 120, via 122, interconnect metal 124, via 126, interconnect metal 128 and via 130. Interconnect metals 112, 116, 120, 124 and 128 are formed in dielectric layers 106b, 106c, 106d, 106e and 106f, respectively.

As illustrated in FIG. 1, semiconductor structure 100 may optionally include isolation structure 142 having ground shield plate 136 and shield sidewalls 138 and 140 under passive component 134. Interior space 141 of isolation structure 142 may be filled with air or any suitable dielectric material as known in the art. Isolation structure 142 having ground shield plate 136 and shield sidewalls 138 and 140, and interior space 141, is configured to electrically isolate passive component 134 from parasitic capacitances from semiconductor substrate 102.

Typically, passive component 134 is formed by using a layer-by-layer process over semiconductor substrate 102 during a back end of line (BEOL) process after active device 104 is formed in semiconductor substrate 102. For example, during the formation of passive component 134, plasma processes and thermal processes can be used to form and pattern various metal layers (not explicitly shown in FIG. 1) in passive component 134. Heat and charge as results of the plasma and thermal processes during the formation of passive component 134 can build up and be transferred to device top electrode 105 of active device 104 through via 145, routing layer 132 and via/interconnect metal stack 108, since active device 104 is not thermally or electrically isolated from passive component 134. The heat and charge can cause a partial or total breakdown of active device 104 due to damage to, for example, a dielectric layer (not explicitly shown in FIG. 1) under device top electrode 105 in active device 104. Furthermore, if too much charge is built up during the fabrication of passive component 134, not only active device 104 can suffer a partial or total breakdown, passive component 134 can also be damaged.

Figure 2:
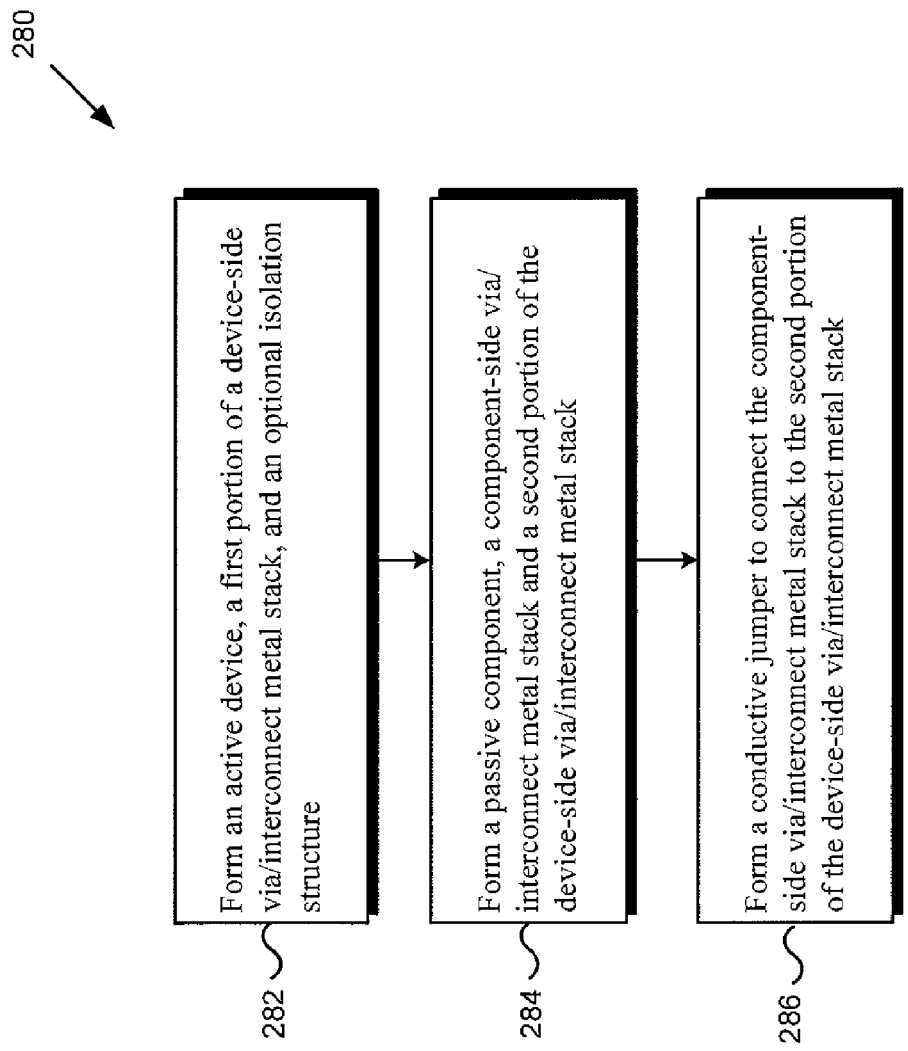
FIG. 2 is a flowchart illustrating a method for fabricating an integrated semiconductor structure according to one implementation of the present application.

Referring to FIG. 2, FIG. 2 illustrates an exemplary diagram illustrating an exemplary method according to an implementation of the present inventive concepts. Certain details and features have been left out of flowchart 280 that are apparent to a person of ordinary skill in the art. For example, an action may consist of one or more sub actions or may involve specialized equipment or materials, as known in the art. Actions 282 through 286 indicated in flowchart 280 are sufficient to describe one implementation of the present inventive concepts, other implementations of the present inventive concepts may utilize actions different from those shown in flowchart 280.

As illustrated in flowchart 280, action 282 includes forming an active device, a first portion of a device-side via/interconnect metal stack, and an optional isolation structure. Action 284 includes forming a passive component, a component-side via/interconnect metal stack and a second portion of the device-side via/interconnect metal stack. Action 286 includes forming a conductive jumper to connect the component-side via/interconnect metal stack to the second portion of the device-side via/interconnect metal stack.

Figure 3A:
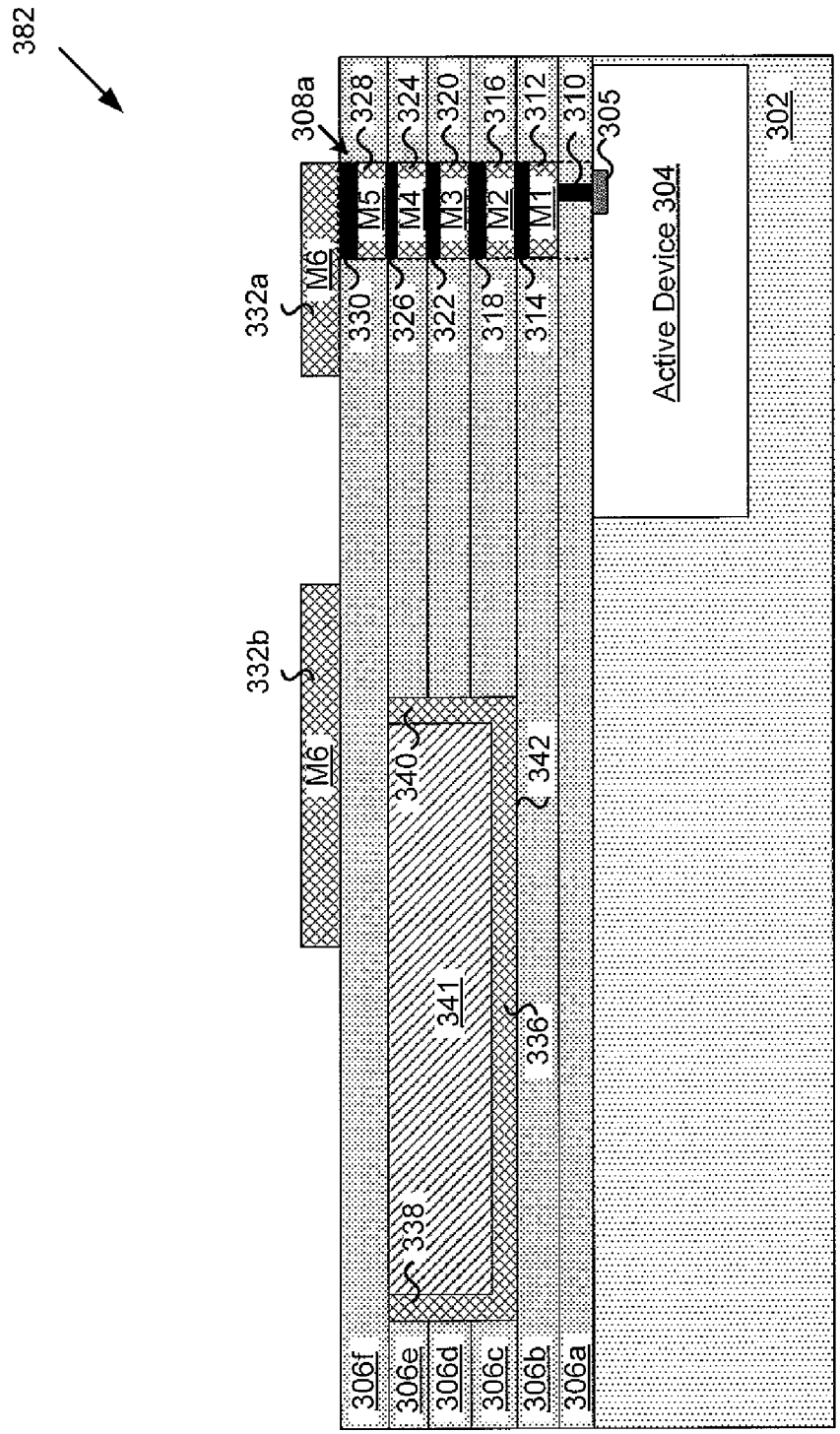
FIG. 3A illustrates a cross-sectional view of a portion of an integrated semiconductor structure processed in accordance with an initial action in the flowchart of FIG. 2 according to one implementation of the present application.
Figure 3B:
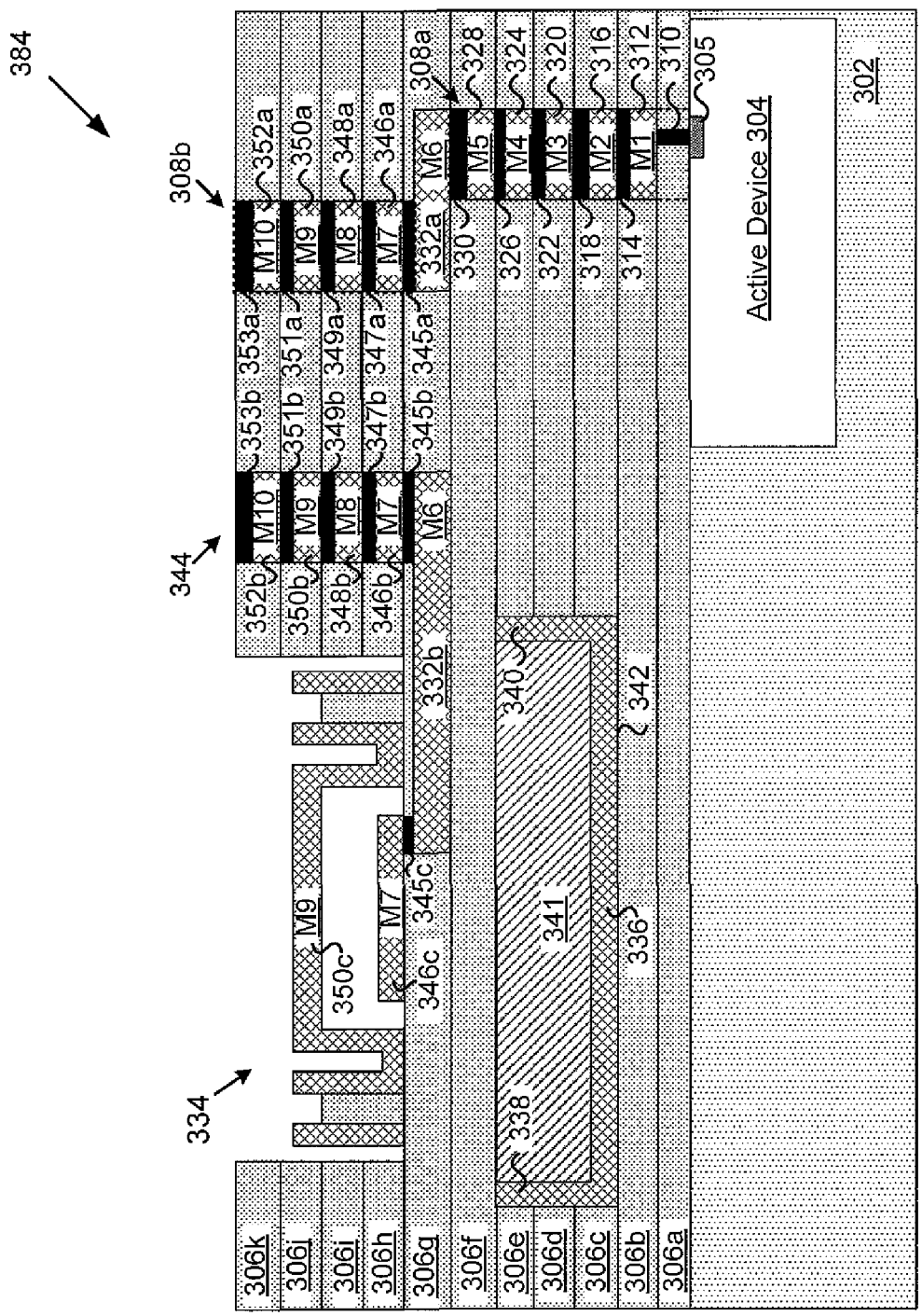
FIG. 3B illustrates a cross-sectional view of a portion of an integrated semiconductor structure processed in accordance with an intermediate action in the flowchart of FIG. 2 according to one implementation of the present application.
Figure 3C:
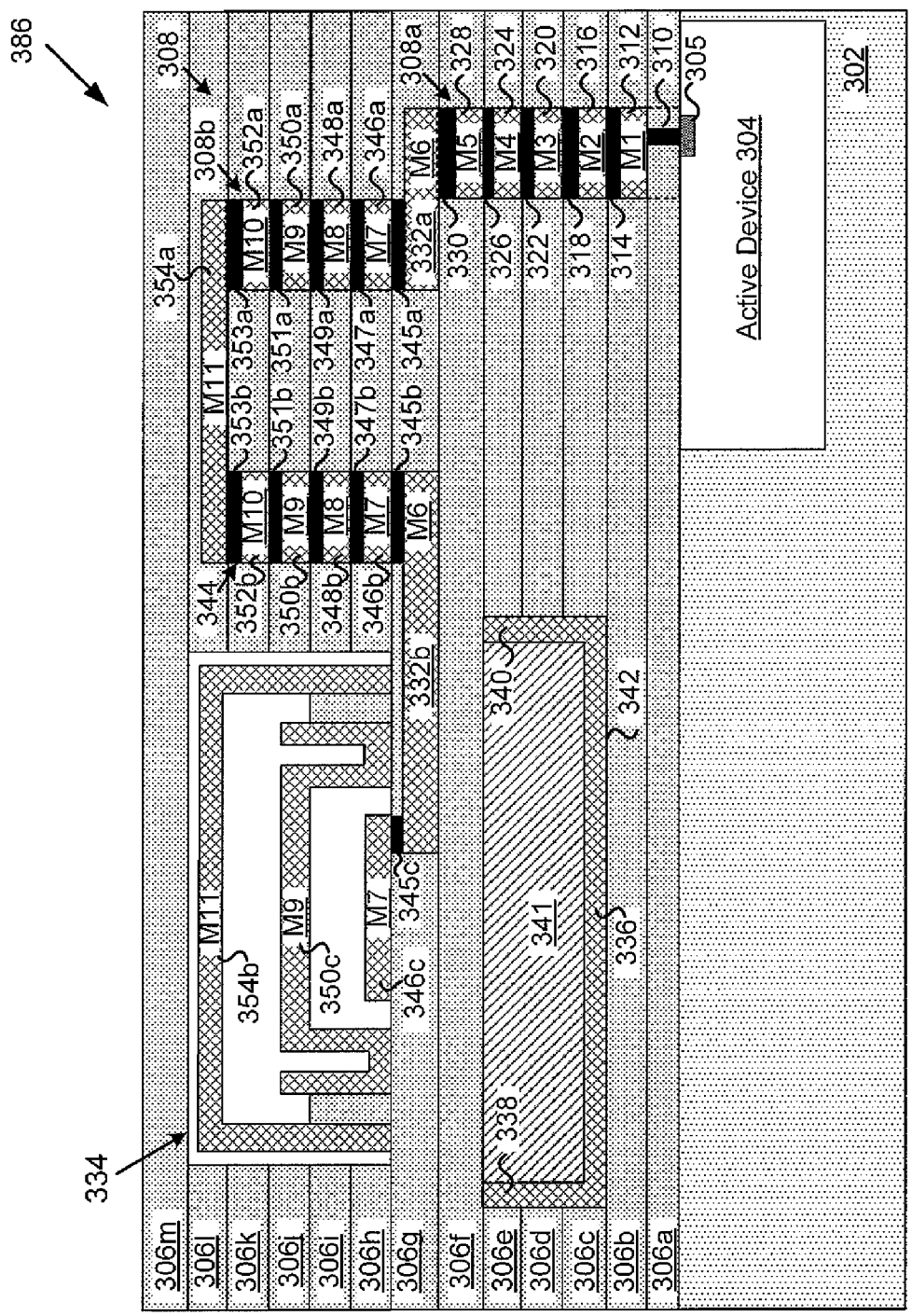
FIG. 3C illustrates a cross-sectional view of a portion of an integrated semiconductor structure processed in accordance with a final action in the flowchart of FIG. 2 according to one implementation of the present application.

FIGS. 3A through 3C illustrate the result of performing actions 282 through 286 of flowchart 280, respectively. For example, FIG. 3A shows semiconductor structure 382 after processing action 282. FIG. 3B shows semiconductor structure 382 in FIG. 3A after the processing of action 284. FIG. 3C shows semiconductor structure 384 in FIG. 3B after the processing of action 286.

Referring to FIG. 3A, FIG. 3A shows an exemplary semiconductor structure having an active device, a first portion of a device-side via/interconnect metal stack, and an optional isolation structure after completion of action 282 of flowchart 280 in FIG. 2. As illustrated in FIG. 3A, semiconductor structure 382 includes semiconductor substrate 302, active device 304, first portion 308a of device-side via/interconnect metal stack 308 and isolation structure 342.

As illustrated in FIG. 3A, active device 304 is formed in semiconductor substrate 302. In the present implementation, semiconductor substrate 302 may include silicon. In other implementations, semiconductor substrate 302 may include other suitable semiconductor substrate material as known in the art. In the present implementation, active device 304 may include one or more CMOS transistors (not explicitly shown in FIG. 3A). For example, device top electrode 305 is a gate electrode of a COMS device (not explicitly shown in FIG. 3A). In other implementations, active device 304 may include one or more field-effect transistors, bipolar transistors, and/or diodes (not explicitly shown in FIG. 3A).

As illustrated in FIG. 3A, first portion 308a of device-side via/interconnect metal stack 308 includes via 310, interconnect metal 312, via 314, interconnect metal 316, via 318, interconnect metal 320, via 322, interconnect metal 324, via 326, interconnect metal 328 and via 330. Via 310 and interconnect metals 312, 316, 320, 324 and 328 respectively formed in dielectric layers 306a, 306b, 306c, 306d, 306e and 306f. In the present implementation, interconnect metals 312, 316, 320, 324, 328 and 332a may be formed by using any suitable metal as known in the art. Vias 310, 314, 318, 322, 326 and 330 may be formed by using any suitable conductive material as known in the art. Dielectric layers 306a through 306f may include silicon oxide and/or silicon nitride. In other implementations, dielectric layers 306a through 306f may include other suitable dielectric material as known in the art.

As illustrated in FIG. 3A, device top electrode 305 is connected to first portion 308a of device-side via/interconnect metal stack 308 through via 310. Interconnect metal 312 is made from metal layer M1 and connected to interconnect metal 316 through via 314. Interconnect metal 316 is made from metal layer M2 and connected to interconnect metal 320 through via 318. Interconnect metal 320 is made from metal layer M3 and connected to interconnect metal 324 through via 322. Interconnect metal 324 is made from metal layer M4 and connected to interconnect metal 328 through via 326. Interconnect metal 328 is made from metal layer M5 and connected to routing segment 332a through via 330.

As illustrated in FIG. 3A, semiconductor structure 382 includes routing segments 332a and 332b, which are made from metal layer M6 and situated over dielectric layer 306f. Routing segment 332a is connected to first portion 308a of device-side via/interconnect metal stack 308, and may serve to connect to a second portion of device-side via/interconnect metal stack 308, which may be built in a subsequent action. Routing segment 332b is situated laterally adjacent to routing segment 332a over dielectric layer 306f, and may serve to connect to a component-side via/interconnect metal stack and a passive component to be built in a subsequent action.

In the present implementation, routing segments 332a and 332b may be formed by depositing a metal layer (e.g., metal layer M6) over dielectric layer 306f, forming and patterning a masking layer to cover routing segments 332a and 332b, and removing portions of the metal layer not covered by the masking layer. As shown in semiconductor structure 382, routing segments 332a and 332b are physically separated and electrically isolated from one another on dielectric layer 306f. In other implementations, routing segments 332a and 332b may be formed in different metal levels and in different dielectric layers, while electrically isolated from one another. For example, routing segment 332a may be formed from metal layer M6, while routing segment 332b may be formed from metal layer M7 or higher metal layers (not explicitly shown in FIG. 3A). Conversely, routing segment 332a may be formed from metal layer M6, while routing segment 332b may be formed from metal layer M5 or lower metal layers. As illustrated in FIG. 3A, semiconductor structure 382 may optionally include isolation structure 342 having ground shield plate 336 and shield sidewalls 338 and 340. Ground shield plate 336, shield sidewalls 338 and 340 and another pair of front and back sidewalls (not explicitly shown in FIG. 3A) form a can-like structure. Interior space 341 of isolation structure 342 may be filled with any suitable dielectric material as known in the art. In another implementation, interior space 341 of isolation structure 342 may include a void filled with air. In one implementation, isolation structure 342 may be tied to a ground potential to electrically isolate a passive component to be built in a subsequent action from parasitic capacitances from semiconductor substrate 302.

Referring to FIG. 3B, FIG. 3B shows an exemplary semiconductor structure having a passive component, a component-side via/interconnect metal stack and a second portion of a device-side via/interconnect metal stack after completion of action 284 of flowchart 280 in FIG. 2. As illustrated in FIG. 3B, semiconductor structure 384 includes passive component 334, component-side via/interconnect metal stack 344 and second portion 308b of device-side via/interconnect metal stack 308, in addition to the features of semiconductor structure 382 shown in FIG. 3A.

As illustrated in FIG. 3B, at least portions of passive component 334, including component bottom plate 346c and component middle plate 350c, are formed in semiconductor structure 384. Component bottom plate 346c and component middle plate 350c of passive component 334 may be formed by using any suitable method as known in the art. In the present implementation, component bottom plate 346c may be formed by patterning metal layer M7 over dielectric layer 306g, and component middle plate 350c may formed by patterning metal layer M9 over dielectric layer 306i. The space between component bottom plate 346c and component middle plate 350c may be formed by depositing a sacrificial material (not explicitly shown in FIG. 3B) over component bottom plate 346c, then removing the sacrificial material after the formation of component middle plate 350c, thereby creating a void, for example. In the present implementation, component bottom plate 346c may be a fixed electrode or an actuation plate of a MHMS device. Component middle plate 350c may be a metal plate with physical support on one or both sides, and configured to move up or down with respect to component bottom plate 346c, for example, due to electrostatic attraction when different voltages are applied to two or more electrodes of passive component 334.

As illustrated in FIG. 3B, component-side via/interconnect metal stack 344 includes via 345b, interconnect metal 346b, via 347b, interconnect metal 348b, via 349b, interconnect meta 1350b, via 351b, interconnect metal 352b and via 353b. Interconnect metals 346b, 348b, 350b and 352b are respectively formed in dielectric layers 306g, 306h, 306i, 306j and 306k. Component bottom plate 346c of passive component 334 is connected to component-side via/interconnect metal stack 344 through via 345c and routing segment 332b. Interconnect metal 346b is made from metal layer M7 and connected to interconnect metal 348b through via 347b. Interconnect metal 348b is made from metal layer M8 and connected to interconnect metal 350b through via 349b. Interconnect metal 350b is made from metal layer M9 and connected to interconnect metal 352b through via 351b. Interconnect metal 352b is made from metal layer M10 and connected to via 353b.

As illustrated in FIG. 3B, semiconductor structure 384 further includes second portion 308b of device-side via/interconnect metal stack 308. Second portion 308b of device-side via/interconnect metal stack 308 includes via 345a, interconnect metal 346a, via 347a, interconnect metal 348a, via 349a, interconnect metal 350a, via 351a, interconnect metal 352a and via 353a. Interconnect metals 346a, 348a, 350a and 352a are respectively formed in dielectric layers 306h, 306i, 306j and 306k. Interconnect metal 346a is connected to routing segment 332a through via 345a. Interconnect metal 346a is made from metal layer M7 and connected to interconnect metal 348a through via 347a. Interconnect metal 348a is made from metal layer M8 and connected to interconnect metal 350a through via 349a. Interconnect metal 350a is made from metal layer M9 and connected to interconnect metal 352a through via 351a. Interconnect metal 352a is made from metal layer M10 and connected to via 353a.

It should be noted that, although FIG. 3B shows second portion 308b of device-side via/interconnect metal stack 308 is formed on a top surface routing segment 332a, and laterally offset from first portion 308a of device-side via/interconnect metal stack 308, in another implementation, second portion 308b of device-side via/interconnect metal stack 308 may be formed directly on top of first portion 308a of device-side via/interconnect metal stack 308 through routing segment 332a without an offset, in which case routing segment 332a is an interconnect metal.

In the present implementation, interconnect metals 346a, 346b, 348a, 348b, 350a, 350b, 352a and 352b may be formed by using any suitable metal as known in the art. Vias 345a, 345h, 347a, 347h, 349a, 349h, 351a, 351b, 353a and 353b may be formed by using any suitable conductive material as known in the art. Dielectric layers 306g through 306k may include silicon oxide and/or silicon nitride. In other implementations, dielectric layers 306g through 306k may include other suitable dielectric material as known in the art.

In the present implementation, at least portions of passive component 334, component-side via/interconnect metal stack 344, and second portion 308b of device-side via/interconnect metal stack 308 may be formed simultaneously in a layer-by-layer process. For example, interconnect metals 346a and 346b and component bottom plate 346c may be formed by depositing metal layer M7 over dielectric layer 306g, forming and patterning a masking layer (not explicitly shown in FIG. 3B) to cover interconnect metals 346a and 346b and component bottom plate 346c, and removing portions of metal layer M7 not covered by the masking layer, for example, by using plasma etching. Similarly, interconnect metals 350a and 350b and component middle plate 350c may be formed by depositing metal layer M9 over dielectric layer 306j, forming and patterning a masking layer (not explicitly shown in FIG. 3B) to cover interconnect metals 350a and 350b and component middle plate 350c, and removing portions of metal layer M9 not covered by the masking layer, for example, by using plasma etching.

It is noted that, in departure from conventional monolithic integration methods, during the fabrication of component bottom plate 346c and component middle plate 350c of passive component 334, passive component 334 is thermally and electrically isolated from active device 304 in semiconductor substrate 302 since routing segments 332a and 332b are physically separated and electrically isolated from one another in semiconductor structure 384. As such, heat and charge from the plasma etching of various metal layers, such as component bottom plate 346c and component middle plate 350c, of passive component 334, cannot be transferred to active device 304, thereby protecting active device 304.

Referring to FIG. 3C, FIG. 3C shows an exemplary semiconductor structure having a conductive jumper connecting a component-side via/interconnect metal stack to a second portion of a device-side via/interconnect metal stack after completion of action 286 of flowchart 280 in FIG. 2. As illustrated in FIG. 3C, semiconductor structure 386 includes passive component 334 having component top plate 354b, and conductive jumper 354a, in addition to the features of semiconductor structure 384 shown in FIG. 3B.

As illustrated in FIG. 3C, component top plate 354b is formed from metal layer M11, and physically separated from component bottom plate 346c and component middle plate 350c. Component top plate 354b may be a fixed electrode of passive component 334. Component top plate 354b may have physical support on one or both sides, and configured receive a voltage from active device 304 through another electrical path (not explicitly shown in FIG. 3C). The space between component top plate 354b and component middle plate 350c may be formed by depositing a sacrificial material (not explicitly shown in FIG. 3C) over component middle plate 350c, then removing the sacrificial material after the formation of component top plate 354b, thereby creating a void, for example. Dielectric layer 306m may be formed over component top plate 354b to create a sealed cavity for passive component 334, for example. By way of example, component bottom plate 346c, component middle plate 350c and component top plate 354b may each have a thickness of 5000 angstroms, and the separation between two neighboring plates may be 3000 angstroms.

As illustrated in FIG. 3C, conductive jumper 354a is formed in dielectric layer 306l, and configured to electrically connect component-side via/interconnect metal stack 344 and second portion 308b of device-side via/interconnect metal stack 308. In the present implementation, conductive jumper 354a and component top plate 354b of passive component 334 may be formed by depositing metal layer M11 over dielectric layer 306k, forming and patterning a masking layer (not explicitly shown in FIG. 3C) to cover conductive jumper 354a and component top plate 354b, and removing portions of metal layer M11 not covered by the masking layer by using, for example, plasma etching.

As illustrated in FIG. 3C, component bottom plate 346c of passive component 334 is situated at an intermediate metal level, such as metal layer M7, higher than device top electrode 305 of active device 304, and conductive jumper 354a is situated at a connecting metal level, such as metal layer M11, higher than component bottom plate 346c. In the present implementation, component top plate 354b is situated at the connecting metal level, such as metal layer M11, as conductive jumper 354a. In other implementations, conductive jumper 354a and component top plate 354b may be formed in different metal levels and in different dielectric layers. For example, conductive jumper 354a may be formed from metal layer M12 (not explicitly shown in FIG. 3C), while component top plate 354b may be formed from metal layer M11 or lower metal levels. Conversely, conductive jumper 354a may be formed from metal layer M10, while component top plate 354b may be formed from metal layer M11 or higher metal levels.

In the present implementation, device top electrode 305 of active device 304 may provide a driving signal to component bottom plate 346c of passive component 334 through a routing path including first portion 308a of device-side via/interconnect metal stack 308, routing segment 332a, second portion 308b of device-side via/interconnect metal stack 308, conductive jumper 354a, component-side via/interconnect metal stack 344, routing segment 332b and via 345c. In the present implementation, device top electrode 305 of active device 304 may be a gate electrode of a CMOS transistor. In other implementations, active device 304 may include bipolar transistors, field-effect transistors, diodes and other active semiconductor devices. In the present implementation, passive component 334 may include a radio frequency MEMS device, such as a variable capacitor, a capacitive switch, an ohmic switch, a piezoelectric resonator, an actuator or a filter. In other implementations, passive component 334 may include resistors, capacitors, transducers, sensors, antennas and other passive semiconductor devices.

As compared to semiconductor structure 100 in FIG. 1, semiconductor structure 386 in FIG. 3C shows that passive component 334 is not electrically connected to active device 304 until conductive jumper 354a is formed to connect component-side via/interconnect metal stack 344 and second portion 308b of device-side via/interconnect metal stack 308. Thus, an electrical path does not exist between passive component 334 and active device 304 prior to the formation of conductive jumper 354a, thereby substantially reducing undesirable heat and charge flow into active device 304 during fabrication of passive component 334. Moreover, since routing segments 332a and 332b are physically separated and electrically isolated from one another, passive component 334 connected to routing segment 332b can have fixed dimensions, such that charge built up during the fabrication of passive component 334 prior to connecting to active device 304 can be within a reasonable predictable range. Also, it should be understood that the methods disclosed in the present application are highly scalable, such that arrays of active devices and passive components can be formed in an integrated semiconductor structure according to the present inventive concepts.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of manufacturing an integrated semiconductor structure, the method comprising:
    forming an active device in a semiconductor substrate, the active device having a device top electrode;
    forming a first portion of a device-side via/interconnect metal stack, wherein the first portion of the device side via/interconnect metal stack is coupled to the device top electrode;
    forming a first portion of a passive component;
    forming a component-side via/interconnect metal stack, wherein the component-side via/interconnect metal stack is coupled to the first portion of said passive component;
    forming a second portion of said device-side via/interconnect metal stack, wherein the second portion of the device side via/interconnect metal stack is coupled to the first portion of the device side via/interconnect metal stack; and then
    forming a conductive jumper to connect said component-side via/interconnect metal stack to said second portion of said device-side via/interconnect metal stack.

2. The method of claim 1, wherein the first portion of said passive component is situated at an intermediate metal level higher than the device top electrode of said active device.

3. The method of claim 1, wherein said conductive jumper is situated at a connecting metal level higher than the first portion of said passive component.

4. The method of claim 3, further comprising forming a second portion of the passive component over the first portion of the passive component, wherein the second portion of the passive component is situated at a metal layer below said connecting metal level.

5. The method of claim 3, further comprising forming a second portion of the passive component over the first portion of the passive component, wherein the second portion of the passive component is situated at a same level as said connecting metal level.

6. The method of claim 1, wherein said active device is configured to provide a driving signal to the first portion of said passive component through said conductive jumper.

7. The method of claim 1, wherein said passive component is a microelectromechanical systems (MEMS) device.

8. The method of claim 7, wherein said MEMS device comprises an actuation plate.

9. The method of claim 7, wherein said MEMS device is a variable capacitor.

10. The method of claim 1, wherein said active device comprises at least one CMOS transistor.

11. The method of claim 1, wherein the forming a first portion of the device-side via/interconnect metal stack is formed through a first set of dielectric layers, the method further comprising forming an isolation structure within the first set of dielectric layers.

12. The method of claim 11, wherein forming the isolation structure comprises forming a ground shield plate and shield sidewalls that extend from the ground shield plate.

13. The method of claim 11, wherein the isolation structure is located between the semiconductor substrate and the first portion of the passive component.

14. The method of claim 1, further comprising simultaneously forming at least portions of the passive component, the component-side via/interconnect metal stack and the second portion of the device-side via/interconnect metal stack.

15. The method of claim 1, further comprising thermally and electrically isolating the first portion of the passive component from the active device during fabrication of the first portion of the passive component.

16. The method of claim 1, further comprising forming a second portion of the passive component over the first portion of the passive component.

17. The method of claim 16, further comprising forming the second portion of the passive component and the conductive jumper from a common metal layer.

18. The method of claim 3, further comprising forming a second portion of the passive component over the first portion of the passive component, wherein the second portion of the passive component is situated above said connecting metal level.

19. The method of claim 1, wherein the conductive jumper forms an electrical path between the passive component and the active device.

* * * * *